(12) United States Patent
Kim et al.

(10) Patent No.: US 12,740,443 B2
(45) Date of Patent: Sep. 15, 2026

(54) VIA CONNECTION STRUCTURE COMPRISING MULTIPLE VIAS AND SUBSTRATE COMPRISING THE SAME

(71) Applicant: ABSOLICS INC., Covington, GA (US)

(72) Inventors: Sungjin Kim, Covington, GA (US); Jincheol Kim, Hwaseong-si (KR)

(73) Assignee: Absolics Inc.

( * ) Notice: Subject to any disclaimer, the term of this patent is extended or adjusted under 35 U.S.C. 154(b) by 444 days.

(21) Appl. No.: 18/010,254

(22) PCT Filed: Sep. 9, 2022

(86) PCT No.: PCT/US2022/042982
§ 371 (c)(1),
(2) Date: Dec. 14, 2022

(87) PCT Pub. No.: WO2023/039118
PCT Pub. Date: Mar. 16, 2023

(65) Prior Publication Data
US 2024/0021507 A1 Jan. 18, 2024

Related U.S. Application Data

(60) Provisional application No. 63/242,625, filed on Sep. 10, 2021.

(51) Int. Cl.
*H10W 70/63* (2026.01)
*H10W 70/60* (2026.01)
(Continued)

(52) U.S. Cl.
CPC ........ *H10W 70/635* (2026.01); *H10W 70/611* (2026.01); *H10W 70/65* (2026.01); *H10W 70/685* (2026.01); *H10W 90/701* (2026.01)

(58) Field of Classification Search
CPC ......... H01L 23/49827; H01L 23/49822; H01L 23/49838; H01L 23/5386
See application file for complete search history.

(56) References Cited

U.S. PATENT DOCUMENTS 5,699,613 A 12/1997 Chong et al.
10,879,206 B1 * 12/2020 Wu ......................... H01L 24/13
(Continued)

FOREIGN PATENT DOCUMENTS

CN 113261094 A 8/2021
JP 9-298365 A 11/1997
(Continued)

OTHER PUBLICATIONS

International Search Report issued on Feb. 3, 2023, in related International Patent Application No. PCT/US 22/42982 (4 pages).
(Continued)

*Primary Examiner* — Michael Jung
(74) *Attorney, Agent, or Firm* — NSIP Law

(57) ABSTRACT

A connection structure of vias is provided. The connection structure includes multiple vias which are disposed within an insulating layer to connect electrical signals in upward and downward directions, the multiple vias comprise a first via and a second via disposed in a vertically stacked relationship with each other, the first via and the second via are configured to meet at a same surface, and the second via and the first via are disposed in respectively different numbers.

9 Claims, 12 Drawing Sheets

(51) Int. Cl.

| | |
|---|---|
| ***H10W 70/65*** | (2026.01) |
| ***H10W 70/685*** | (2026.01) |
| *H10W 90/00* | (2026.01) |

(56) References Cited

U.S. PATENT DOCUMENTS

| | | | | |
|---|---|---|---|---|
| 11,616,018 | B2 * | 3/2023 | Lee | H01L 24/13 257/621 |
| 2007/0090546 | A1 * | 4/2007 | Shioga | H01L 23/50 257/E23.079 |
| 2009/0115073 | A1 * | 5/2009 | Sunohara | H05K 1/0271 257/E23.141 |
| 2011/0026232 | A1 | 2/2011 | Lin et al. | |
| 2011/0147057 | A1 * | 6/2011 | Takada | H01L 21/4846 174/257 |
| 2011/0186936 | A1 | 8/2011 | Iwamatsu et al. | |
| 2013/0001794 | A1 * | 1/2013 | Roy | H01L 23/50 257/774 |
| 2013/0037944 | A1 | 2/2013 | Lee et al. | |
| 2013/0134548 | A1 * | 5/2013 | Torii | H01L 23/481 257/508 |
| 2016/0165723 | A1 * | 6/2016 | Romero | H01L 23/49827 174/251 |
| 2017/0133336 | A1 | 5/2017 | Oliver et al. | |
| 2017/0207158 | A1 | 7/2017 | Kang et al. | |
| 2018/0061749 | A1 * | 3/2018 | Farooq | H01L 23/481 |
| 2018/0323174 | A1 * | 11/2018 | Mueller | H01L 21/76838 |
| 2020/0196444 | A1 | 6/2020 | Jin et al. | |
| 2021/0375759 | A1 * | 12/2021 | Lee | H01L 23/522 |
| 2022/0301981 | A1 * | 9/2022 | Chang | H01L 24/19 |
| 2024/0072442 | A1 * | 2/2024 | Liao | H01L 23/49822 |

FOREIGN PATENT DOCUMENTS

| | | | |
|---|---|---|---|
| JP | 2001-284815 | A | 10/2001 |
| JP | 2013-197548 | A | 9/2013 |
| JP | 2015-2263 | A | 1/2015 |
| JP | 2015-50343 | A | 3/2015 |
| JP | 2015-95615 | A | 5/2015 |
| JP | 2018-198271 | A | 12/2018 |
| JP | 2019-186284 | A | 10/2019 |
| JP | 2019-212881 | A | 12/2019 |
| KR | 10-1335987 | B1 | 12/2013 |
| KR | 10-2015-0046615 | A | 4/2015 |
| KR | 10-2017-0093048 | A | 8/2017 |
| KR | 10-2021-0065083 | A | 6/2021 |
| KR | 10-2021-0071074 | A | 6/2021 |
| WO | WO 2012/053130 | A1 | 4/2012 |
| WO | WO 2020/180149 | A1 | 9/2020 |

OTHER PUBLICATIONS

Written Opinion of the International Search Authority issued on Feb. 3, 2023, in related International Patent Application No. PCT/US 22/42982 (6 pages).

Lau, J., et al. “Redistribution layers (RDLs) for 2.5 D/3D IC integration.” Journal of Microelectronics and Electronic Packaging 11.1 (2014): (13 pages in English).

Chinese Office Action issued on Jul. 3, 2026, in counterpart Chinese Patent Application.

* cited by examiner

VIA CONNECTION STRUCTURE COMPRISING MULTIPLE VIAS AND SUBSTRATE COMPRISING THE SAME

CROSS REFERENCE TO RELATED APPLICATIONS

This application is a U.S. National Stage Application of International Application No. PCT/US2022/042982, filed on Sep. 9, 2022, which claims the benefit under 35 USC 119(a) and 365(b) of U.S. Provisional Patent Application No. 63/242,625, filed Sep. 10, 2021, the entire disclosures of which are incorporated herein by reference for all purposes.

BACKGROUND

1. Field

The following description relates to a via connection structure including multiple vias and a substrate including the same.

2. Description of Related Art

In order to achieve high efficiency and performance in a packaging of a semiconductor, electrical conductivity between a semiconductor chip and a mainboard is important. In a typical semiconductor packaging process, a via is formed in a substrate, a conductive metal such as copper is filled in the via to form a conductive layer, and a channel applicable for communications is formed.

An operation that applies an inorganic substrate such as a plate glass as a package substrate has been recently implemented. Particularly, in the example of a plate glass, preventing the occurrence of warp while maintaining a proper stiffness of a glass substrate is desired. Therefore, a solution which can secure excellent conductivity while preventing

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In a general aspect, a connection structure of vias includes multiple vias multiple vias disposed within an insulating layer, wherein the multiple vias comprise a first via and a second via disposed in a vertically stacked relationship with each other, wherein the first via and the second via are configured to meet at a same surface, and wherein the second via and the first via are disposed in respectively different numbers.

The multiple vias may be configured to transmit electrical signals in an upward direction and a downward direction.

A substrate includes a through hole which penetrates the substrate in a thickness direction; a core substrate within which the through hole is disposed; and a rewiring layer formed on a first surface of the core substrate, wherein the substrate comprises an electrically conductive layer disposed in a predetermined shape, wherein the electrically conductive layer comprises a core conductive layer and a rewiring conductive layer, wherein the core conductive layer comprises a first conductive layer disposed in contact with the first surface of the core substrate, a through conductive layer disposed in the through hole, and a second conductive layer disposed in contact with a second surface of the core substrate, wherein the rewiring conductive layer is embedded in the rewiring layer, wherein the core conductive layer and the rewiring conductive layer are electrically connected to each other, and wherein the rewiring conductive layer comprises an insulating layer and a connection structure of vias.

The second via may be disposed on the first via, the first via comprises a first via hole and a first via pad connected to each other, the second via is connected to the first via through the first via hole and the first via pad, and two or more second vias are disposed per one first via contacting with the first via pad.

An interval between the second via contacting with the first via pad is equal to or greater than 0.2 μm.

A size of the second via contacting with the first via pad may be a value of 10 μm to 100 μm.

The second via may include a plurality of vias disposed in a row on the first via.

The second via may be disposed on the first via pad in a number of 3 or more vias, and the second via comprises vias disposed in a polygonal shape by surrounding the center of the via pad.

The core substrate may be one of a silicon-based ceramic substrate, a glass-based ceramic substrate, a glass substrate, or combinations thereof.

An electronic device substrate includes through holes which penetrate the substrate in a thickness direction; a core substrate where the through holes are disposed; and an upper rewiring layer disposed on a first surface of the core substrate, wherein the substrate comprises an electrically conductive layer disposed in a predetermined shape and configured to transmit electrical signals, wherein the electrically conductive layer is configured to electrically connect an upper portion of the core substrate and a lower portion of the core substrate through at least some of the through holes, wherein the upper rewiring conductive layer is an electrically conductive layer disposed in the upper rewiring layer, and wherein a rewiring conductive layer of the electrically conductive layer comprises multiple vias configured to transmit electrical signals in an upward direction and a downward direction, wherein the multiple vias comprise a first via and a second via disposed in a vertically stacked relationship with each other, and wherein the first via and the second via are configured to meet at a same surface, and wherein the second via and the first via are disposed in respectively different numbers.

Other features and aspects will be apparent from the following detailed description, the drawings, and the claims.

BRIEF DESCRIPTION OF DRAWINGS

Throughout the drawings and the detailed description, the same reference numerals may refer to the same, or like, elements. The drawings may not be to scale, and the relative size, proportions, and depiction of elements in the drawings may be exaggerated for clarity, illustration, and convenience.

DETAILED DESCRIPTION

Figure 1A:
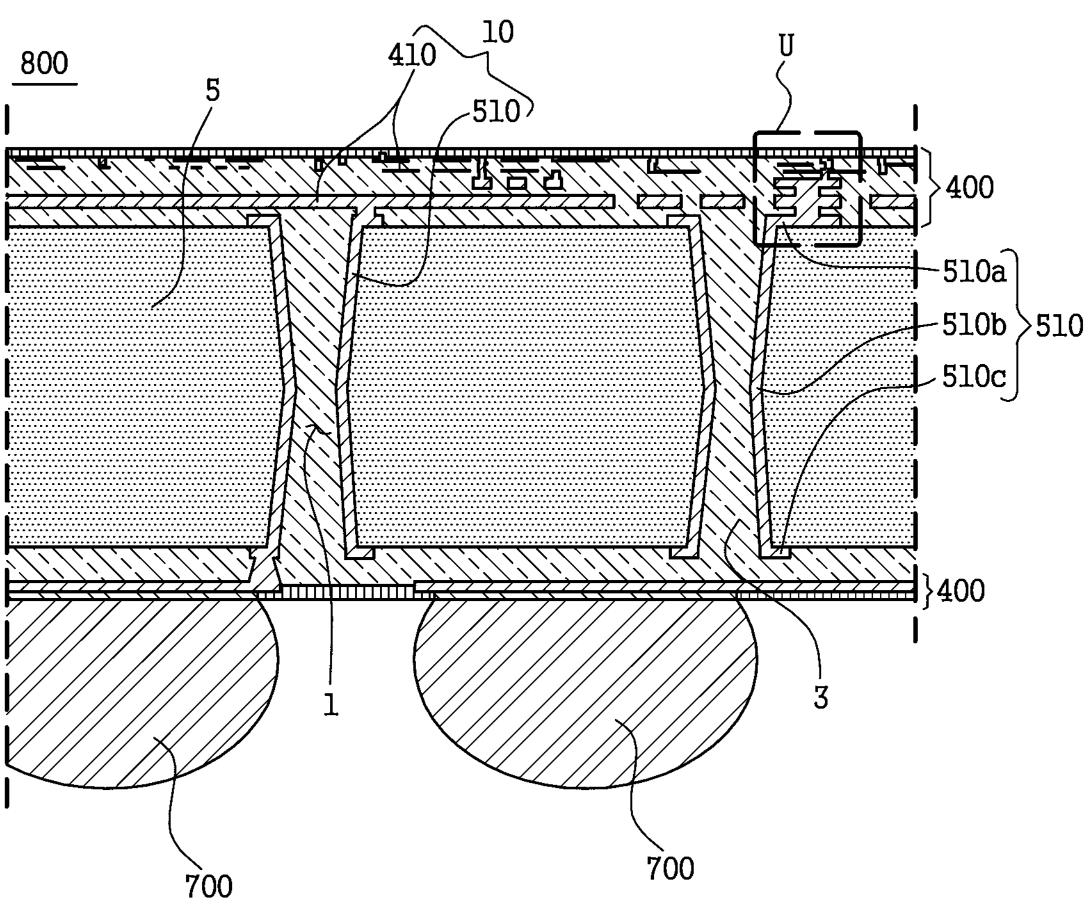
FIG. 1A illustrates an example substrate, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

In this application, "B being placed on A" means that B is placed in direct contact with A or placed over A with another layer or structure interposed therebetween and thus should not be interpreted as being limited to B being placed in direct contact with A.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

In the one or more examples, the description of "A and/or B" means "A, B, or A and B."

In The one or more examples, terms such as "first," "second," "A," or "B" are used to distinguish the same terms from each other.

In the one or more examples, a singular form is contextually interpreted as including a plural form as well as a singular form unless specially stated otherwise.

One or more examples may provide a substrate applied to semiconductor packaging with high performance by increasing conductive efficiency while maintaining mechanical properties of a substrate through a via connection structure including multiple vias.

In an example, a via connection structure and a substrate applied with multiple vias according to example embodiments may increase conductive efficiency of a substrate, and may minimize defects that may occur inside a via during a plating process. Additionally, by optionally applying a connection structure to plural vias, a substrate that implements an efficient semiconductor packaging substrate may be provided.

Figure 1B:
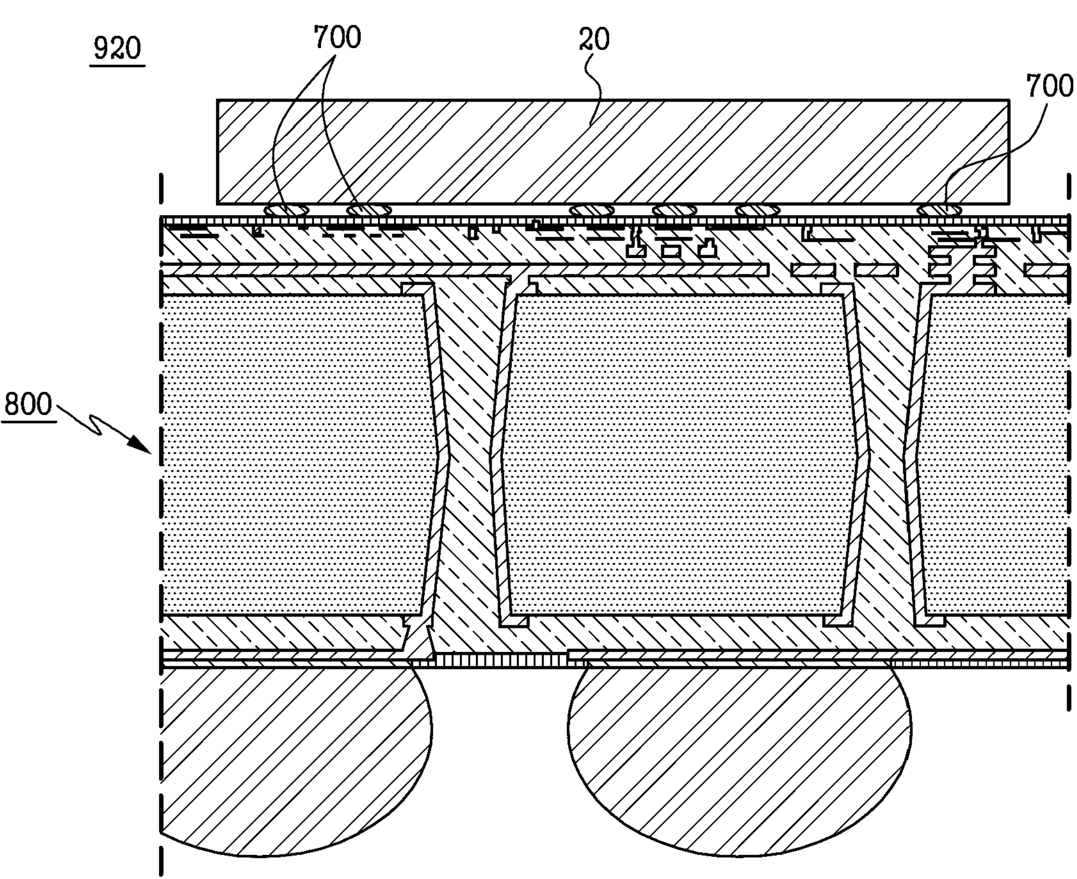
FIG. 1B illustrates an example a packaged semiconductor, in accordance with one or more embodiments.
Figure 2:
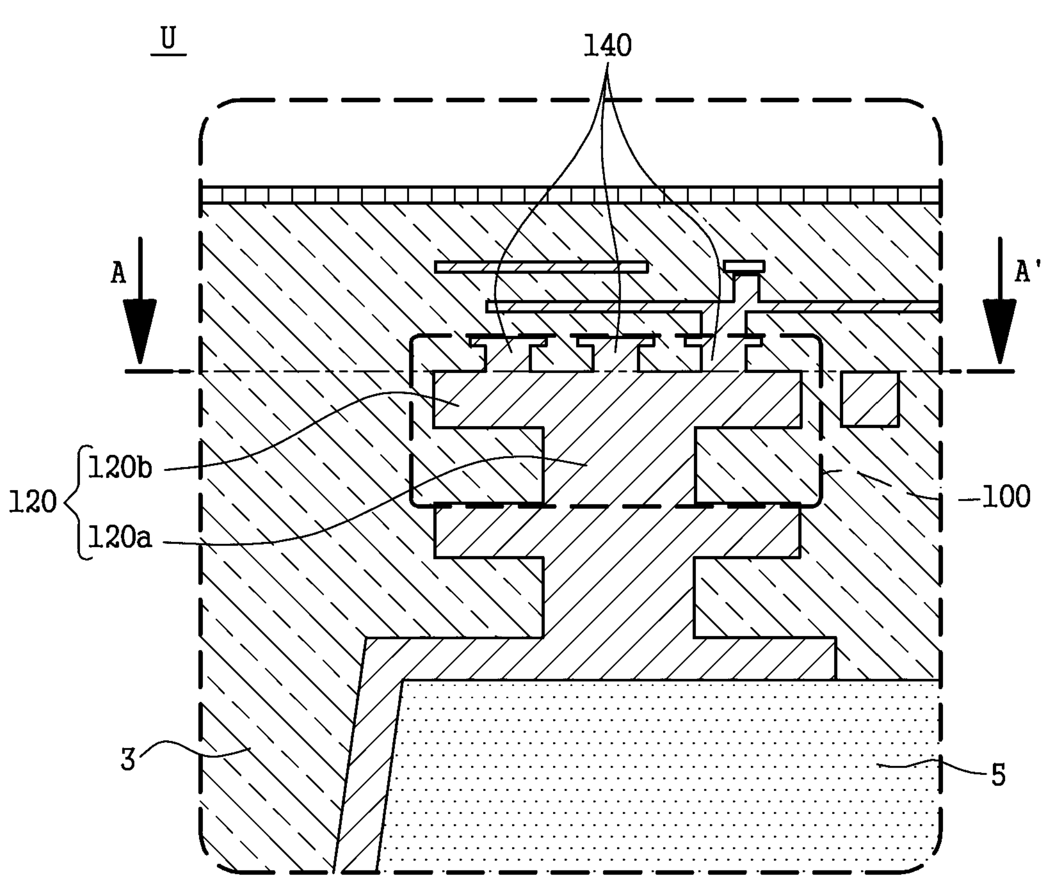
FIG. 2 illustrates an enlarged illustration of the U portion of FIG. 1.
Figure 3A:
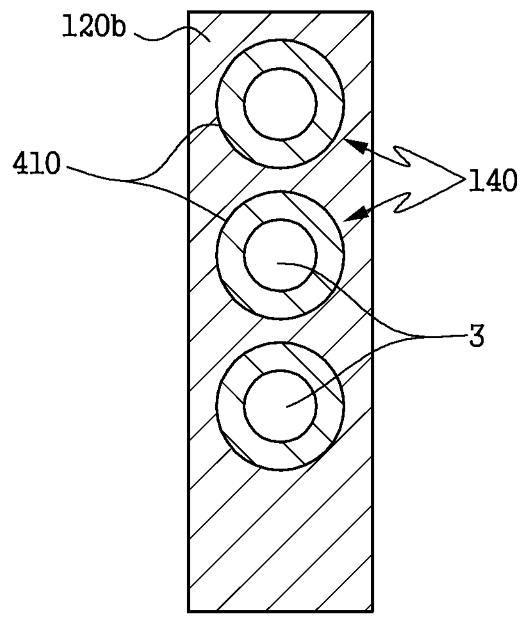
FIG. 3A and FIG. 3B illustrate an example of multiple vias, in accordance with one or more embodiments. (The view seen at the A-A' section of FIG. 2).
Figure 3B:
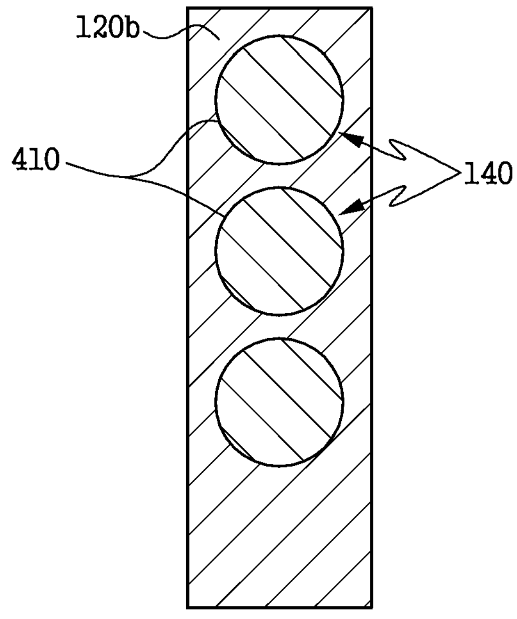
Figure 4A:
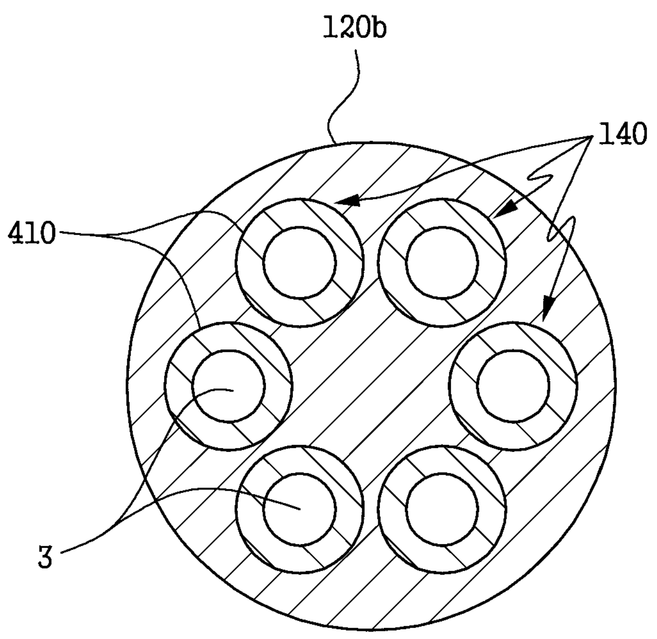
FIG. 4A, FIG. 4B, and FIG. 4C are illustrate an example of multiple vias, in accordance with one or more embodiments. (The view seen at the A-A' section of FIG. 2).
Figure 4B:
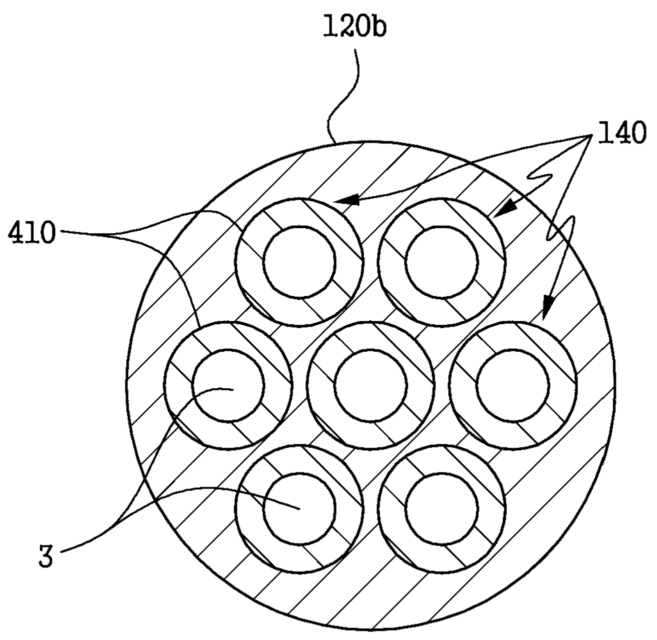
Figure 4C:
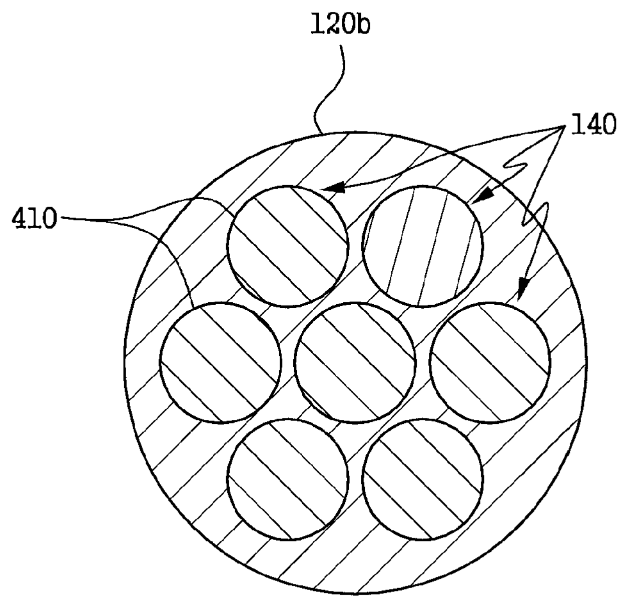
Figure 5:
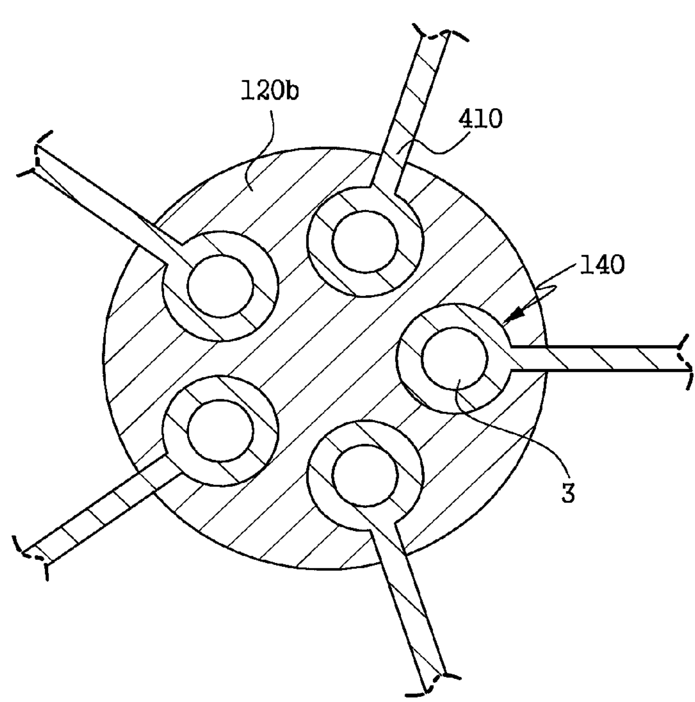
FIG. 5 illustrates an example of multiple vias, in accordance with one or more embodiments. (The view seen at the A-A' section of FIG. 2).

FIG. 1A illustrates an example substrate according to one or more examples by using a section thereof, and FIG. 1B illustrates an example of a packaged semiconductor, in accordance with one or more embodiments. FIG. 2 illustrates an enlarging U portion of FIG. 1, and FIG. 3A and FIG. 3B are respectively illustrate an example of multiple vias, in accordance with one or more embodiments. FIGS. 4A, 4B and 4C respectively illustrate other examples, and FIG. 5 illustrates an example of multiple vias, in accordance with one or more embodiments. Hereinafter, with reference to FIG. 1A to FIG. 5, the one or more examples will be described in further detail.

Connection Structure of Via

Referring to FIG. 2, via structure, in accordance with one or more embodiments, comprises multiple vias 100.

The multiple vias 100 are disposed within an insulating layer 3, and transmit electrical signals in upward and downward directions. The multiple vias 100 comprise a first via 120 and a second via 140 disposed in an upward direction and a downward direction from each other, or in a vertical relationship with each other, and the first via 120 and the second via 140 may meet at one surface.

In the multiple vias 100, the second via 140 and the first via 120 facing each other at the one surface may be disposed in respectively different numbers as one characteristic (refer to FIG. 2).

In examples, the second via 140 may be disposed on the first via 120, or may be disposed under the first via 120.

Hereinafter, for example, the second via 140 is described by a reference of being disposed on the first via 120.

The first via 120 may comprise a first via hole 120*a* and a first via pad 120*b* connected to each other.

The second via 140 may be connected to the first via hole 120*a* and the first via pad 120*b*. Specifically, the second via 140 may be a structure of a rewiring conductive layer disposed in the first via hole 120*a* contacting with the first via pad 120*b* and a rewiring conductive layer of the second via 140 contacting with the first via pad 120*b* to enable conduction thereof.

The number of the second vias 140 per one first via 120 contacting with the first via pad 120*b* may be, as examples, two or more, three or more, or four or more. The number of the second vias 140 may be, as examples, 150 or less, or 100 or less. The number of the second vias 140 may be, as examples 15 or less, or 8 or less per one first via 120.

When applying plural second vias 140 per one first via 120, it is possible to embodying a design of a rewiring layer designed more elaborately in a predetermined space, and it is also possible to provide an efficient flow of an electrical current although applying an electric power with a high frequency.

The first via hole 120 and the second via hole 140 may have rewiring conductive layers respectively and independently disposed thereon, and meanwhile, the rewiring conductive layer may be disposed in only some parts of the internal areas of the via holes (refer to FIG. 3A, FIG. 4A and FIG. 4B), or may be disposed by filling the whole of the internal areas of the via holes (refer to FIG. 3B and FIG. 4C). When the rewiring conductive layer is disposed in only some parts of the internal area of the via hole 120 or 140, an insulating layer may be disposed in the other parts of the internal area of the via hole 120 or 140.

The second via 140 may be formed by selectively forming an electrically conducive layer in a via hole positioned at a needed spot, after the formation of plural second via holes, and filling the other via holes with an insulating layer. Additionally, the second via 140 may be formed by a method of selectively forming second vias holes at needed spots and subsequently forming an electrically conducive layer.

The interval between the second vias 140 contacting with the first via pad 120*b* may have a length, as examples, of 0.2 μm or more, 0.5 μm or more, or 0.7 μm or more. The interval may be, as examples, 2 μm or less, 1 μm or less, 0.8 μm or less.

The size of the second via 140 that is in contact with the first via pad 120*b* may be, as examples, 10 μm or more, 15 μm or more, 20 μm or more, or 25 μm or more. The size may be, as examples, 100 μm or less, 80 μm or less, or 70 μm or less. In such an example, although applying an electric force with a high frequency, it is possible to provide an efficient flow of an electrical current.

When the section of the second via 140 is a circle, the size may be a diameter.

When the section of the second via 140 is a polygon, the size may be the average of lengths of respective sides.

The second vias 140 may be disposed in a row on the first via pad 120*b* (refer to FIG. 3A and FIG. 3B). In FIG. 3A and FIG. 3B, the first via pad 120*b* may have a long quadrangle shape, as an example. However, the shape of the first via pad 120*b* is not limited thereto. Additionally, a separate conductive wire may not be connected to the second via 140 as an example in FIG. 3A and FIG. 3B. However, a second via 140 connected with a conductive wire as illustrated in FIG. 5, may be applied, and depending on the implementation, some of the vias may be applied to be linked with a conductive wire with others not connected with a conductive wire.

In an example, the second via 140 may be disposed in the number of 3 or more, and may comprise a shape of being disposed at an apex of a polygon on the first via pad 120*b* (refer to FIG. 4A). Additionally, a second via 140 may be additionally disposed inside the polygon as needed (refer to FIG. 4B and FIG. 4C). FIG. 4A, FIG. 4B and FIG. 4C illustrate a first via pad 120*b* in a circular shape. However, the shape of the first via pad 120*b* is not limited thereto. Additionally, a second via 140 not connected with a separate conductive wire is illustrated in FIG. 4A, FIG. 4B and FIG. 4C, and a second via 140 connected with a conductive wire may be applied as FIG. 5. Depending on the implementation, some vias 140 connected with a conductive wire may be applied with other vias 140 that are not connected with a conductive wire.

Multiple vias of the examples may be applied to a rewiring layer of a substrate and the like, and may be more useful in transmitting electrical signals efficiently in upward and downward directions.

A substrate applied with a connection structure of vias in one or more examples is more advantageous to be applied as a use of semiconductor packaging. In embodiments, a typical interposer with plural steps applied to a substrate is combined as a single packaging substrate where a rewiring layer has been disposed, and it is possible to help adjustment of a scale variation of a rewiring layer necessarily required in the upper and lower portions of packaging, while minimizing the volume thereof.

Additionally, a connection structure of vias of embodiments may be applied to a rewiring layer of an upper or lower portion of a substrate, and may help minimizing the influence of a skin effect which may be easily caused from an alternating current with a high frequency.

Substrate 800 and Use of Substrate as Packaging Substrate

Referring to FIG. 1A, a substrate 800, in accordance with one or more embodiments, may comprise through holes 1 which is a hole that penetrates a substrate in the thickness direction; a core substrate 5 where the through holes have been disposed; and a rewiring layer 400 formed on one surface of the core substrate.

The substrate 800 comprises an electrically conductive layer 10 disposed in a predetermined shape, and the electrically conductive layer 10 comprises a core conductive layer 510 and a rewiring conductive layer 410.

The core conductive layer 510 is an electrically conductive layer disposed in contact with one surface of the core substrate, and refers to a case of not interposing another electrically conductive layer between the substrate and the core conductive layer.

The core conductive layer 510 may comprise a first-side conductive layer 510*a* disposed in contact with a first surface of the core substrate, a through conductive layer 510*b* disposed in the through hole, and a second-side conductive layer 510*c* disposed at a lower surface of the substrate 800 to be contacted with a second surface of the core substrate.

For example, the through conductive layer 510*b* may be formed in the internal area of a through hole that penetrates the core substrate. Specifically, the through conductive layer may be disposed on the inner diameter surface of the through hole. Specifically, the through conductive layer may be disposed in the shape of filling the inner diameter surface of the through hole. A buffer layer may be comprised further between the inner diameter surface of the through hole and the through conductive layer, to help attachment thereof and a plating process to be made easily. An empty portion of the through hole may be filled with an insulating layer.

The rewiring conductive layer 410 may be disposed by being embedded in the rewiring layer 400.

The rewiring layer may comprise an insulating layer covering the rewiring conductive layer.

The insulating layer and the rewiring layer may be formed in multilayers in a manufacturing process, but the border may not be observed because the same material is applied to the upper and lower portions.

The core conductive layer 510 and the rewiring conductive layer 410 are connected electrically by some parts thereof.

The detailed description of multiple vias and the connection structure of vias is overlapped with the above description and thus the further description is omitted.

The core substrate 5 may be a ceramic substrate.

The core substrate 5 may be one selected from the group consisting of a silicon-based ceramic substrate, a glass-based ceramic substrate, a glass substrate, and combinations thereof.

The ceramic substrate may be for example, a silicon-based ceramic substrate or a glass-based ceramic substrate. The silicon-based ceramic substrate may be a substrate comprising a silicon substrate, a silicon carbide substrate, or the like in some parts or the whole thereof. The glass-based ceramic substrate may be a substrate comprising a quartz substrate, a sapphire substrate, or the like in some parts or the whole thereof.

The glass substrate may be for example, an alkali borosilicate plate glass, a non-alkali borosilicate plate glass, a non-alkali alkali-earth borosilicate plate glass, and the like, and any plate glass applicable as an electronic component may be applied thereto.

The core substrate 5 may have a thickness, as examples, of 50 μm or more, 100 μm or more, 250 μm or more, 400 μm or more, or 500 μm or more. The core substrate may have a thickness, as examples, of 3000 μm or less, 1000 μm or less. When the core substrate is applied with such a thickness range, it is possible to have great utilization as a substrate for semiconductor packaging.

The implementation of a substrate of embodiments as a semiconductor packaging substrate is an implementation of a substrate comprising a through hole which is a hole that penetrates the substrate in the thickness direction; a core substrate where the through holes have been disposed; and an upper rewiring layer formed on one surface of the core substrate, as a semiconductor packaging substrate. The substrate for an electronic device comprises an electrically conductive layer disposed in a predetermined shape to transmit electrical signals, the electrically conductive layer connects the upper portion and the lower portion of the core substrate through some of the through holes, the upper rewiring conductive layer is an electrically conductive layer disposed by being embedded in the upper rewiring layer, the rewiring conductive layer comprises multiple vias transmitting electrical signals in upward and downward directions, the multiple vias comprise a first via and a second via disposed to be up and down from each other, the first via and the second via meet at one surface, and the second via and the first via facing each other at the contacted surface are disposed respectively different numbers.

The description of the multiple vias and the substrate is overlapped with the above description and thus the further description is omitted.

Packaged Semiconductor 920

In one general aspect, a packaged semiconductor 920, in accordance with one or more embodiments, may comprise a substrate 800 described in the above; and a semiconductor element 20 loaded in the substrate (refer to FIG. 1B). The detailed description of the substrate is overlapped with the above description and thus the further description is omitted.

The semiconductor element 20 may be for example, one being disposed on a substrate as disclosed in FIG. 1B, however, the element is not limited thereto, and plural semiconductor elements may be disposed on the substrate, inside a cavity (not shown) of the substrate, under the substrate, or to a combination thereof.

The semiconductor element may be an active element, or a passive element.

For example, an operation element such as a CPU and a GPU, a memory element such as a memory chip, or the like may be applied, or the above elements may be applied together side by side or by being laminated together.

The semiconductor element may be a semiconductor element with a high frequency. When the semiconductor element with a high frequency, it is preferable to apply a glass substrate or a glass-based ceramic substrate as a core substrate. In such an example, to be different from a ceramic substrate composed of silicon or silicon carbide, a phenomenon of a parasite element may not occur at a high frequency, and dissipation in electric force, heat, and the like may be decreased.

In FIG. 1B, a bump 700 is exemplified to electrically connect the semiconductor element and the substrate 800, but the method for connection is not limited to applying a bump.

Figure 6:
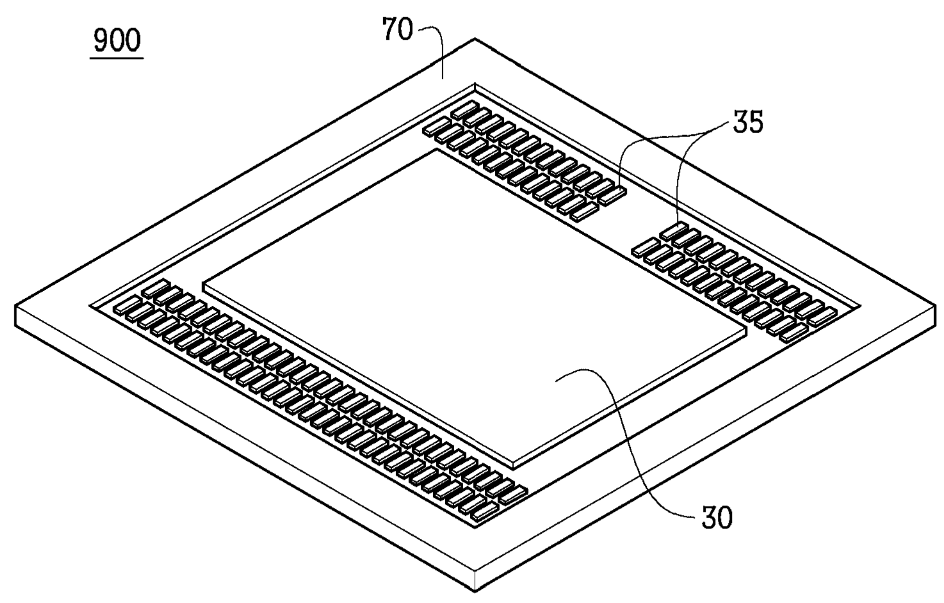
FIG. 6 illustrates a perspective drawing one of an example semiconductor package, in accordance with one or more embodiments.
Figure 7:
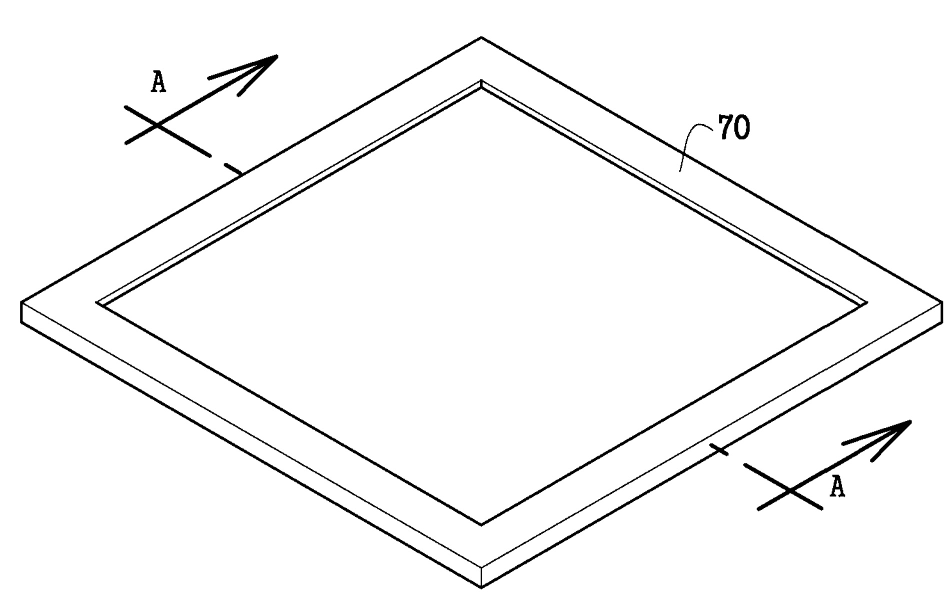
FIG. 7 illustrates a perspective drawing one of an example packaging substrate, in accordance with one or more embodiments.
Figure 8:
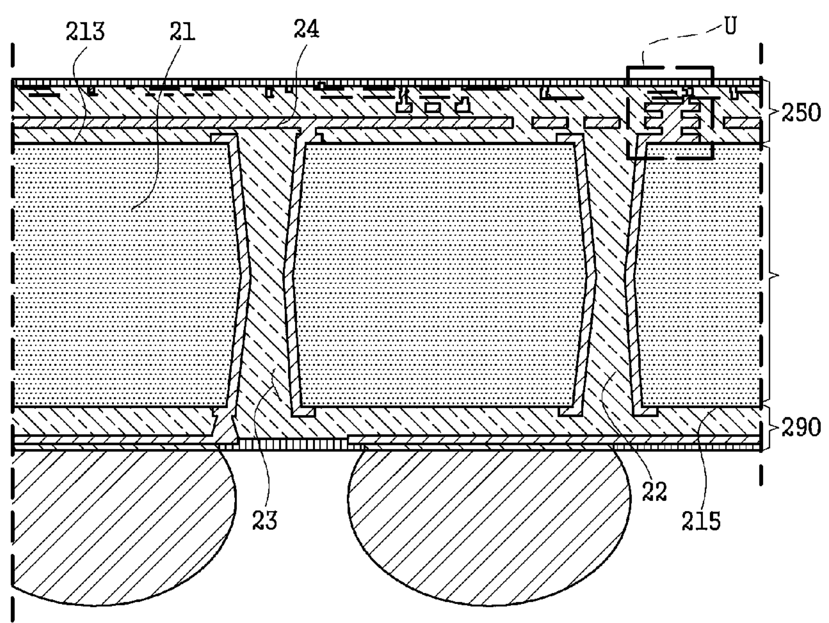
FIG. 8 illustrates an example of a section of a packaging substrate, in accordance with one or more embodiments.
Figure 9:
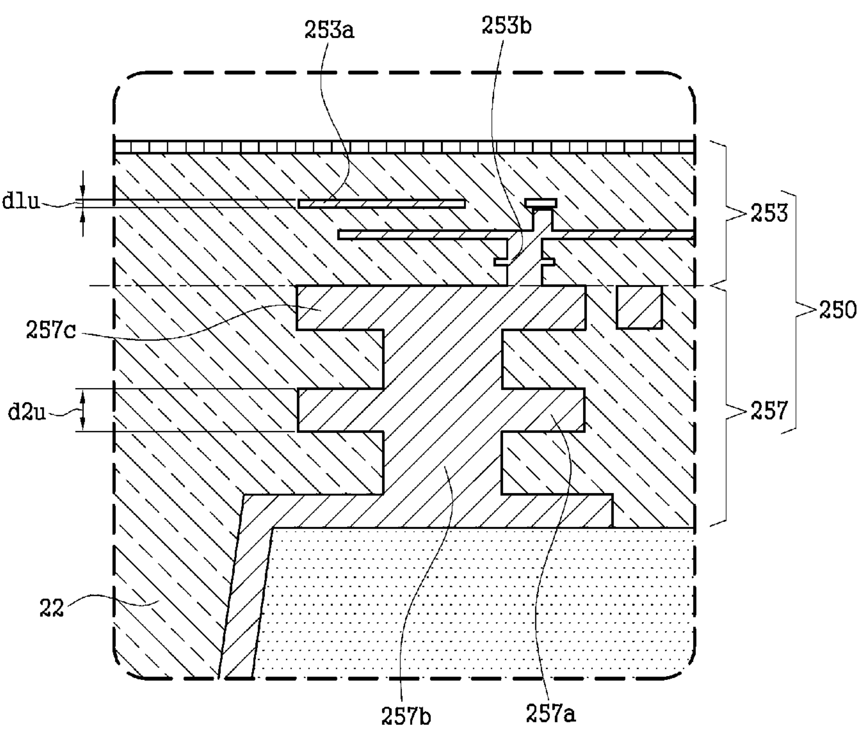
FIG. 9 illustrates an example rewiring layer of the enlarged U portion of FIG. 8.
Figure 10:
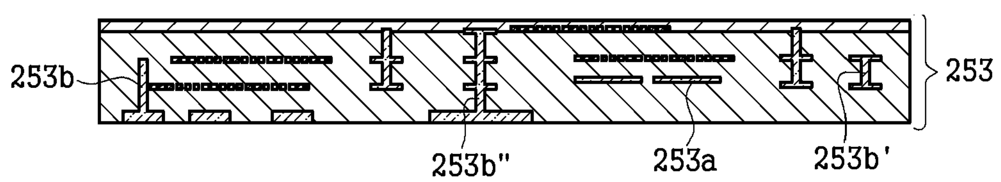
FIG. 10 illustrates an example of a section of a fine layer of a packaging substrate, in accordance with one or more embodiments.
Figure 11:
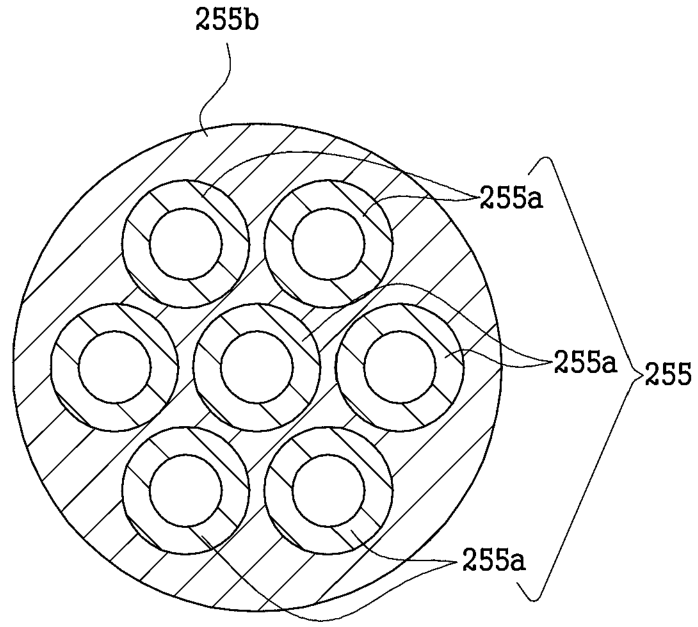
FIG. 11 illustrates an example of a section of multiple vias, in accordance with one or more embodiments.
Figure 12:
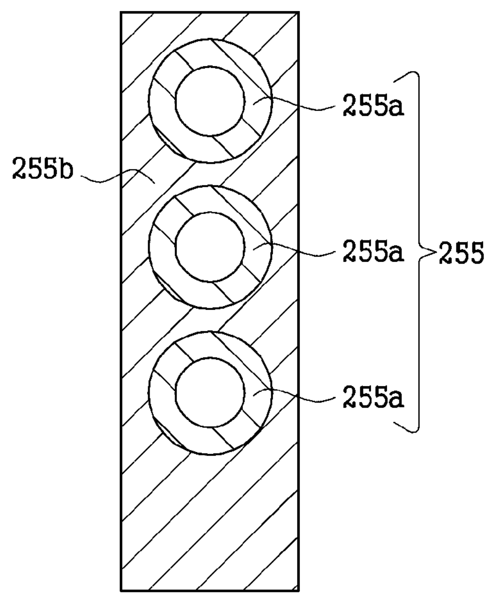
FIG. 12 illustrates an example of a section of multiple vias, in accordance with one or more embodiments.
Figure 13:
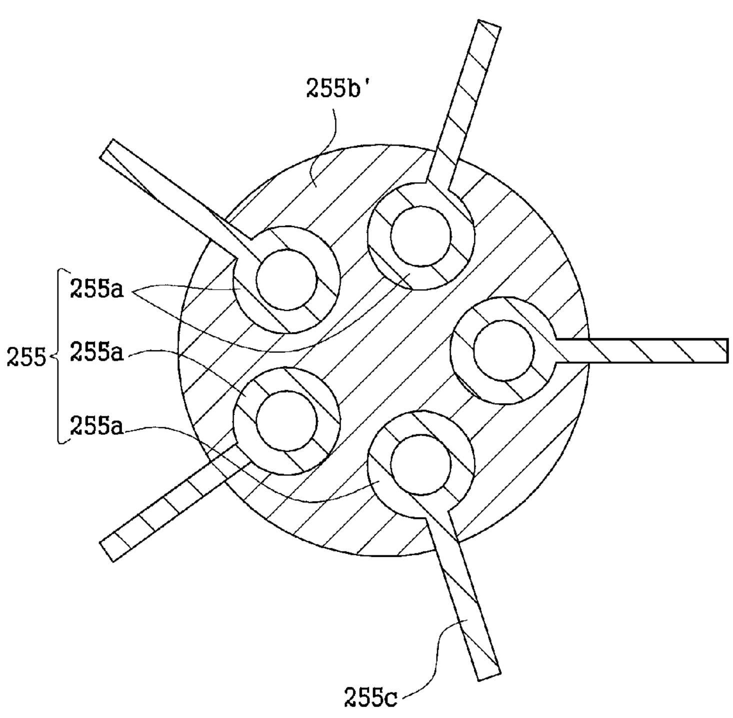
FIG. 13 illustrates an example of multiple vias, in accordance with one or more embodiments.
Figure 14:
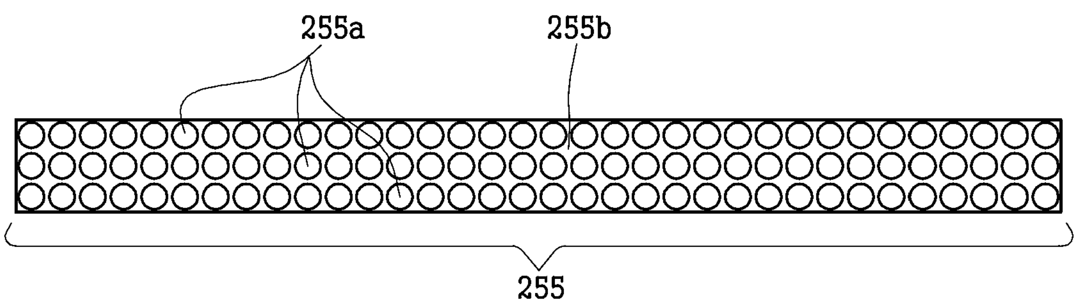
FIG. 14 illustrates an example of multiple vias, in accordance with one or more embodiments.
Figure 15:
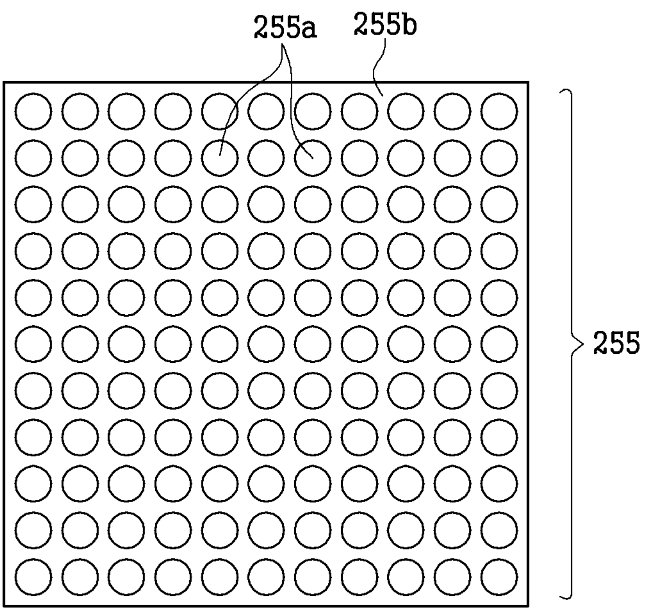
FIG. 15 illustrates an example of multiple vias, in accordance with one or more embodiments.
Figure 16:
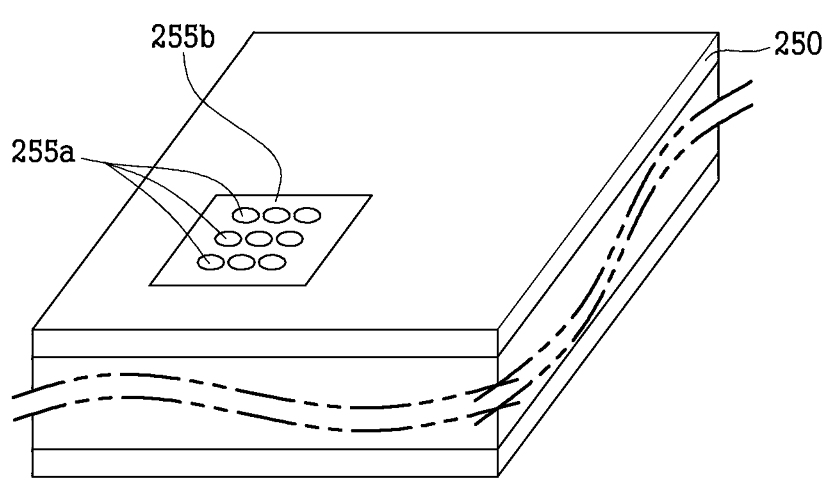
FIG. 16 illustrates a perspective drawing of some parts of a packaging substrate, in accordance with one or more embodiments.
Figure 17:
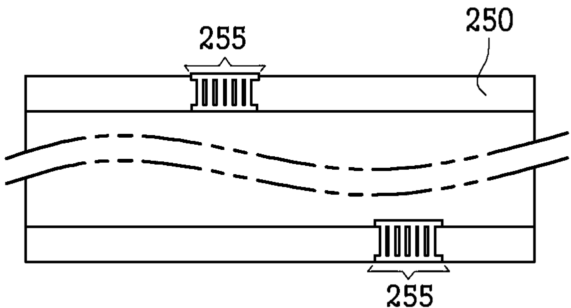
FIG. 17 illustrates a section of some parts of a packaging substrate, in accordance with one or more embodiments.

FIG. 6 is a perspective drawing illustrating an example of a semiconductor package, in accordance with one or more embodiments, and FIG. 7 is a perspective drawing illustrating an example of a packaging substrate, in accordance with one or more embodiments. FIG. 8 is a drawing illustrating an example of a section of a packaging substrate, in accordance with one or more embodiments, and FIG. 9 is a drawing illustrating an example of a rewiring layer by enlarging U portion of FIG. 8. FIG. 10 is a drawing illustrating an example of a section of a fine layer of a packaging substrate, in accordance with one or more embodiments, FIG. 11 is a drawing illustrating an example of a section of multiple vias, in accordance with one or more embodiments. FIG. 12 is a drawing illustrating an example of a section of multiple vias, in accordance with one or more embodiments, and FIG. 13 is a drawing illustrating an example of multiple vias, in accordance with one or more embodiments. FIG. 14 is a drawing illustrating an example of multiple vias, in accordance with one or more embodiments, and FIG. 15 is a drawing illustrating an example of multiple vias, in accordance with one or more embodiments. FIG. 16 is a perspective drawing illustrating some parts of a packaging substrate, in accordance with one or more embodiments, and FIG. 17 is a drawing illustrating a section of some parts of a packaging substrate, in accordance with one or more embodiments s. Hereinafter, with reference to FIG. 6 to FIG. 17, the present disclosure will be described.

Via Structure

A via structure, in accordance with one or more embodiments, transmits electrical signals in an upward and downward direction from the inside of a redistribution layer of a packaging substrate 200, wherein the packaging substrate may comprise a glass substrate, the via structure may comprise multiple vias 255, and the multiple vias 255 may comprise at least two or more small vias 255*a* adjacent from one another.

The packaging substrate 200 and multiple vias 255 are the same as described above, and thus the overlapped description is omitted.

The packaging substrate 200 may apply such a via structure, and thereby may increase conductive efficiency, and may minimize defect problems that may occur during a plating process, while maintaining mechanical properties of a glass substrate.

Substrate for Packaging 200

Referring to FIG. 8, in one general aspect, a packaging substrate, in accordance with one or more embodiments, may comprise a core substrate 21 comprising a through hole 23; a redistribution layer 250 formed on a first surface 213 of the core substrate; a core conductive layer having conductive layers formed sequentially in some parts on the first surface 213 and some parts on the second surface 215 of the core substrate and the through hole; a redistribution conductive layer formed in the redistribution layer, wherein the core substrate 21 may comprise a glass substrate, the core conductive layer and redistribution conductive layer may be electrically connected in at least some parts thereof. The redistribution conductive layer may comprise multiple vias 255 transmitting electrical signals in an upward and downward direction, and the multiple vias 255 may comprise two or more small vias 255*a* adjacent to each other.

Additionally, in one general aspect, a packaging substrate according to embodiments may comprise, a core substrate 21 comprising a through hole 23; and a redistribution layer 250 formed on a first surface 213 of the core substrate, wherein the core substrate may comprise a glass substrate, and the packaging substrate may have a multilayer structure, wherein the multilayer structure may comprise a fine layer 253 and a coarse layer 257 arranged in an upward and downward direction from each other, wherein the coarse layer may comprise a coarse layer via 257*b* transmitting electrical signals in an upward and downward direction; a coarse layer via conductive layer formed in the coarse layer via; and a coarse layer upper pad 257*c* disposed in an upper portion of the coarse layer via, wherein the fine layer may comprise a fine layer via 253*b* transmitting electrical signals in an upward and downward direction; and a fine layer via conductive layer formed in the fine layer via, wherein the coarse layer upper pad and the fine layer via conductive layer may be electrically connected from each other, the size of the fine layer via may be smaller than the size of the coarse layer upper pad, the fine layer via may comprise a small via, and the small vias may be arranged in the number of two or more on the one coarse layer upper pad.

Any one or more vias among the coarse layer vias 257*b* and the fine layer vias 253*b* may comprise multiple vias 255, and the multiple vias 255 may comprise two or more small vias 255*a*.

Any glass substrate applicable in a semiconductor field may be used as the core substrate 21, and for example, a borosilicate glass substrate, a non-alkali glass substrate, and the like may be applied, but the one or more examples are not limited thereto. The core substrate may be a commercial product, and the products manufactured by manufacturers such as CORNING, SCHOTT, AGC, and the like may be applied.

Referring to FIG. 8, the through hole 22 penetrates the first surface 213 and the second surface 215 of the core substrate 21, is referred to as TGV (through glass via) or the like, and may be formed in a predetermined position of a core substrate by implementing a method such as etching.

The through hole 22 efficiently connects a semiconductor element which may be loaded in the first surface 213, with the second surface 215, while maintaining a supporting role of a core substrate. "Connection" may refer to an electrical connection through a conducting wire.

The core substrate 21 may further comprise a cavity (not shown) selectively in a predetermined position. For example, a passive element may be disposed in the cavity.

The redistribution layer 250 may comprise a conducting wire 24 having a predetermined pattern; and an insulating material 22; and the conducting wire may be disposed inside the insulating material.

Referring to FIG. 9, which is an enlarged U portion of FIG. 8, the redistribution layer 250 may comprise a fine layer 253 and a coarse layer 257 arranged upward and downward from each other. "Arranged upward and downward" may mean the fine layer is disposed in an upper portion and the coarse layer is disposed in a lower portion.

The fine layer 253 and the coarse layer 257 may have a size of a conducting wire, a via, a diameter of multiple vias and the like that are different from each other.

A thickness ratio of a coarse layer 257 may be about 0.8 times to five times, or about one to three times based on the fine layer 253. In such an example, a redistribution layer may be implemented more efficiently.

The fine layer 253 may comprise a fine layer conducting wire 253*a* having a predetermined pattern and a thickness d1*u*, and a fine layer via 253*b* connecting a conducting wire to upper and lower sides.

The coarse layer 257 may comprise a coarse layer conducting wire 257*a*, and a coarse layer via 257*b* connecting a conducting wire to upper and lower sides. The coarse layer conducting wire illustrated in FIG. 4 may be a coarse layer via pad.

The fine layer vias 253*b* and the coarse layer vias 257*b* may be subdivided into a through hole via, a blind via, a buried via, and the like.

The fine layer 253 may comprise a fine layer via (fine layer blind via) 253*b* whose one end is plugged up, a fine layer buried via 253*b*' whose both ends are plugged up, a fine layer through hole via 253*b*" whose both ends are opened, and the like as illustrated in FIG. 5.

A portion except for a conducting wire within the fine layer 253 and the coarse layer 257 may be filled with an insulating material, and this insulating material may be not obviously distinct in the section.

The fine layer 253 may further comprise a passivation layer in an upper portion.

The thickness d1*u* of the fine layer conducting wire 253*a* may have a smaller value than the thickness d2*u* of the coarse layer conducting wire 257*a*.

The ratio of the d1*u* may be about 0.7 or less, or 0.1 or more based on the thickness d2*u* of the coarse layer conducting wire 257*a*.

The thickness d1*u* of the fine layer conducting wire 253*a* may be a width of a conducting wire pattern which may be formed in the fine layer 253, and the thickness d2*u* of the coarse layer conducting wire 257*a* may be a width of a conducting pattern which may be formed in the coarse layer 257.

The thickness d1*u* of the fine layer 253*a* may be about 5 μm or less, or 1 μm or more.

Multiple vias 255 transmitting electrical signals in an upward and downward direction from the redistribution layer 250 may be comprised in coarse layer vias 257*b*, and may be comprised in fine layer vias 253*b*. The coarse layer vias and the fine layer vias may be substituted by the multiple vias.

With reference to FIGS. 12 and 13, the multiple vias 255 may be, as only examples, at least two or more, nine or more, or one hundred or more small vias 255*a* congregated with fixed intervals, and if having fixed intervals, the multiple vias 255 may be applied without limitation in a total number. Among small vias 255*a* of the multiple vias 255, one small via and another small via may have a minimum interval of approximately 0.5 μm to 25 μm, or approximately 1 μm to 15 μm. By having such an interval, the inside of a via may be plated well and defect occurrence may be reduced. When small vias are congregated without intervals and thereby form one hole, there is a risk of generating a concaved dimple and a void during via filling of a conductive metal in a plating process, and a possibility of poor electrical properties may be increased.

For example, plural small vias 255*a* may be arranged in one direction as illustrated in FIG. 12, or plural small vias or the center thereof may be congregated as a close-packed plane as illustrated in FIG. 6. The close-packed plane may have a similar or the same shape as 0001 surface of a hexagonal close packed structure of an atom crystal structure. In an example, the small vias may be congregated by having minimum intervals of 1 μm to 3 μm from one another, and three to eight small vias may be adjacent to one small via.

Additionally, the plural small vias 255*a* may have a monomer congregated in a shape of a triangle, equilateral triangle, quadrangle, lozenge, pentagon to octagon, and the like, as only examples, and thereby form multiple vias 255.

The multiple vias 255 may comprise a multiple via pad 255*b* which may be disposed in one height of small via 255*a*. A small via conductive layer which may be disposed inside the small via may be electrically connected with the multiple via pad, and the conductive via pad may be connected to a redistribution conductive layer disposed in the same layer having a similar height.

The size of the multiple via pad 255*b* may be approximately 10 μm to 200 μm, or about 15 μm to 150 μm. By having such a size, a small via conductive layer inside a small via 255*a* of multiple vias 255 may easily enable electric connection with other components through a multiple via pad.

The section of the multiple via pad 255*b* viewed at an upper position may have, as examples a quadrangle shape, a circular shape, or an oval shape. When the section of the multiple via pad is a rectangle shape, small vias 255*a* may be arranged to be disposed along a longer direction. When the section of the multiple via pad is a circular shape, small vias adjacent to one small via may be congregated to be three to eight and disposed. For example, small vias may be arranged to form multiple vias in a multiple via pad in a rectangle shape as illustrated in FIG. 14 or may be arranged to form multiple vias in a multiple via pad in a square shape as illustrated in FIG. 10.

As illustrated in FIG. 13, when small vias 255 are respectively electrically connected to separate small via distribution lines 255*c* while equipping a small via pad in the end, a multiple via pad may be conductive or may be composed of a non-conductive via pad 255*b*'.

The inside of a small via 255*a* of the multiple vias 255 may have a conductive layer formed along the inner diameter surface, after that the vacant space may be filled with an insulating material 22 and the like, and all the inside space may be filled with a conductive metal, a conductive layer, and the like. According to this, the multiple vias and small vias may transmit electrical signals in an up-and-down direction.

The small vias 255*a* may comprise a small via conductive layer. The small via conductive layer may be connected to a redistribution conductive layer or may be connected to another component depending on the type of the multiple vias.

As illustrated in FIG. 16, small vias 255*a* of the multiple vias 255 may include a first set, (for example, the first row) the inside of which is totally filled with a conductive layer, a second set (for example, the middle row), the inside surface of which has a conductive layer formed thereon and the residual space of which is filled with an insulating material 22 and the like, and a third set (for example, the third row), the inside surface of which has only a conductive layer formed thereon.

In examples, the size of the small via 255*a* may be approximately 3 μm to 20 μm, approximately 5 μm to 15 μm, or approximately 8 μm to 14 μm. By a small via having such a size, it is possible to prevent the occurrence of defects such as a concaved dimple, a void during a plating process, and it is possible to effectively achieve conductivity.

The sectional shape of the small via 255*a* viewed at an upper position may be a circle, an oval, a polygonal shape such as triangle to octagon having curved sides, and a shape of simple closed curve. The circumference of the small via may comprise an arc, an elliptical arc, a curve, and the like, and may not comprise angular sides. When an angular side is comprised, there is a risk of generating a seam void.

The size of a section to the depth of a section may have a ratio of 0.01 to 1:1, or to 0.5:1 as viewed at an upper position of the small via 255*a*.

The sectional shape of the small via 255*a* viewed at a side position may have an upper opening which is the same as or larger than the lower opening.

FIG. 17 illustrates a section of multiple vias 255 viewed at a side position, and some of the multiple vias may be comprised inside a redistribution layer 250, and may be comprised or not comprised in a lower redistribution layer and the like.

Additionally, the multiple vias 255 may comprise a mid-size via.

The size of the mid-size via may be, as only examples, 75 μm to 200 μm, or 100 μm to 125 μm.

The sectional shape of the mid-size via 255*a* viewed from an upper position may be, as examples, a circle, an oval, a polygonal shape such as triangle to octagon having curved sides, and a shape of simple closed curve. The circumference of the mid-size via may comprise, as examples, an arc, an elliptical arc, a curve, and the like within a range satisfying the above size range, and may not comprise angular sides. When an angular side is comprised, there is a risk of generating a seam void.

When the mid-size via has an angular side, the side may have a certain radius of curvature, and for example, the radius of curvature may be 15 μm or more, or 40 μm or less. In such an example, the occurrence of a seam void can be substantially inhibited.

An insulating material 22, which may be filled in a through hole 23 of the core substrate 21, the inside of the multiple vias 255, and the like, may comprise a polymer resin and inorganic particles. The inorganic particles may for example, comprise silica particles, but are not necessarily limited thereto. For example, the inorganic particles may have an average diameter of 100 nm or less, or 20 nm or more, or may have a mingled inorganic particle group the average diameter difference of which is 10 nm to 20 nm.

The polymer resin may be an epoxy resin, the UV curing of which is applicable, but is not limited thereto. In an example, the epoxy resin may be a resin in which a phenol-based curing agent is applied to an epoxy resin, one in which a cyanate ester is applied to an epoxy resin, or one in which a phenolic ester curing agent is applied to an epoxy resin.

The insulating material 22 may be applied in a state having the inorganic particles dispersed in a polymer resin which is not cured or semi-cured. The insulating material comprises inorganic particles different in the diameter in a regular ratio to obtain a sufficient insulating effect. Subsequently, the insulating material is arranged to flow well even in a fine crevice and not to form a void substantially in a redistribution layer 250, and after that may be fixed by curing of a polymer resin.

As the insulating material 22, a buildup film ABF available from AJINOMOTO may be applied, but any insulating material applied to the formation of a redistribution layer may be applicable without limitation.

The insulating material 22 may be applied by a method of disposing a buildup film on the formed conducting wire and performing depressurizing lamination, but is not necessarily limited thereto.

The packaging substrate 200 may further comprise a lower redistribution layer 290 under the second surface 215. The lower redistribution layer 290 may comprise a lower redistribution line (not shown). The lower redistribution line may comprise a lower conducting wire (not shown) having a predetermined pattern and a predetermined thickness and a lower via (now shown) connecting a conducting wire to upper and lower sides.

The lower vias may comprise multiple vias 255 described above or may substitute them.

The packaging substrate 200 may further comprise a lower passivation layer located under a lower redistribution layer 290. The lower passivation layer may comprise a solder and the like, and through this, may be electrically connected to a mainboard or the like.

The packaging substrate 200 may further comprise a passivation layer located on an upper surface of a redistribution layer 250. The passivation layer may further comprise a bump and the like, and accordingly, may transmit signals to an element 30.

Referring to FIG. 7, the packaging substrate 200 may further comprise a lid 70 located on an upper surface of a redistribution layer 250. The lid may help to emitting heat from elements or a substrate to the external environment, and may serve to protect a core substrate 21 from external impact. A hole or a slot, which can be combined with a pin, may be formed in one side of the lid, and this may increase convenience when a packaging substrate is fixed during a manufacturing process or after the manufacture.

The packaging substrate 200 may comprise an electric power transmission element 35 disposed on the surface or in the inside thereof. The electric power transmission element may be for example, a passive element, but is not necessarily limited thereto. The electric power transmission element may be a capacitor, and for example, a multilayer ceramic capacitor (MLCC) may be applied.

The electric power transmission element 35 may be disposed on a redistribution layer 250, and may be disposed in a cavity which may be formed inside a core substrate 21. Also, the electrical power transmission element may be disposed in a cavity which may be formed inside a redistribution layer.

Semiconductor Package 900

In one general aspect, a package substrate 800 according to embodiments may comprise, a packaging substrate 200; and an element 30 loaded on the packaging substrate.

FIG. 6 illustrates the package Semiconductor Package 900 roughly.

The element 30 may be, as an example, a calculation element such as a central processing unit (CPU) and a graphic processing unit (GPU) or may be a memory element such as a memory chip, and they may be applied together side by side or by being laminated.

The element 30 may be a high-frequency semiconductor element. When a high-frequency semiconductor element is applied with a substrate for packaging together, it may heighten efficiency because a parasite element or the like is not substantially generated in a high-frequency environment to be different from a silicon substrate or the like. In this example, a redistribution layer in a compact size can be embodied to be different from a prepreg substrate.

The description of the packaging substrate 200 is the same as the above description, and thus the further description is omitted.

Manufacturing Method for Substrate for Packaging 200

In one general aspect, a manufacturing method for a packaging substrate according to embodiments may comprise, an operation A that prepares a core substrate as a glass substrate in which a through hole 23 is formed; an operation B that forms a coarse layer 257 on the core substrate; and an operation C that forms a fine layer 253 on the coarse layer.

The operation B may comprise a process of forming a coarse layer via 257*b*, and a process of forming a conductive layer in the coarse layer via.

The process of forming a conductive layer in the coarse layer via 257*b* may be performed by forming a coarse layer upper pad 257*c* with forming a conductive layer inside the coarse layer via at the same time, or may be performed by forming them separately. The process of forming the coarse layer upper pad may form a coarse layer conducting wire with a conductive layer together to be disposed in the same height as the coarse layer upper pad.

The process of forming a conductive layer in the coarse layer via 257*b* may perform filling the inside of a via with a conductive metal, or may perform filling with an insulating material after the formation of some conductive layer. Depending on the implementation, the inside of a via may be filled with an insulating material without the formation of a conductive layer.

The operation C may comprise a process of forming a fine layer via 253*b*, and a process of forming a conductive layer in the fine layer via.

The process of forming a conductive layer in the fine layer via 257*b* may be performed by forming a conductive layer inside the fine layer via with forming a fine layer upper pad at the same time, or may be performed by forming them separately. The process of forming the fine layer upper pad may form a fine layer conducting wire with a conductive layer together to be disposed in the same height as the fine layer upper pad.

The process of forming a conductive layer in the fine layer via 253*b* may perform filling the inside of a via with a conductive metal, or may perform filling with an insulating material after the formation of some conductive layer.

The fine layer 253 may comprise a fine layer conducting wire 253*a* having a predetermined pattern and a thickness d1*u*.

The coarse layer 257 may comprise a coarse layer conducting wire 257*a* having a predetermined pattern and a thickness d2*u*.

The operation B may comprise, an operation B-1 of forming multiple vias 255 as coarse vias in predetermined positions of the first layer of an insulating material on a core substrate 21; an operation B-2 of forming a coarse layer conducting wire 257*a* having a predetermined pattern and a thickness d2*u* of the first layer of the insulating material on a core substrate 21; and an operation B-3 of performing the operations B-1 and/or B-2 repetitively depending on the desired number of laminated layers, thereby laminating insulating material layers.

Additionally, the operation B may further comprise an operation of forming a coarse layer through hole via as a coarse via in a predetermined position of an insulating material after the operations B-2 and/or B-3.

The operation C may comprise, an operation C-1 for forming fine layer vias 253*b* in predetermined positions of the first floor of an insulating material on a coarse layer 257; an operation C-2 for forming a fine layer conducting wire 253*a* having a predetermined pattern and a thickness d1*u* of the first layer of the insulating material by using a plating method; and an operation C-3 of performing the operations C-1 and/or C-2 repetitively depending on the desired number of laminated layers, thereby laminating insulating material layers.

Additionally, the operation C may further comprise an operation of forming a fine layer through hole via as a fine layer via in a predetermined position of an insulating material after the operations C-2 and/or C-3.

The formation of multiple vias of the operation B-1 may proceed in a method of laser etching and/or plasma etching. The formation of multiple vias may be performed by adjusting positions and intervals of small vias, and in this time, the detailed shape and the interval may be the same as described in the above.

The formation of multiple vias of the operation B-1 may proceed with the operation C at the same time, or may proceed separately.

The formation of fine layer vias 253*b* of the operation may be performed by a method of laser etching and/or plasma etching, and the formation of the fine layer vias may be substituted by the formation of multiple vias.

The operations B-2 and C-2 may further comprise a process of deburring and desmear treatment before forming plating. The desmear treatment may be processed by a dry or wet method, and may be performed by removing smears that may be residual through plasma, or may be processed through chemical treatment in the order of a sweller, permanganate, and a counteragent.

The operation B-2 and C-2 may further comprise a process of primer treatment to the surface of a target before forming plating. The primer treatment may apply a silane compound or an imidazole compound. The silane compound may be one applicable as a silane coupling agent or one in which a functional group is added to the former. For example, the silane compound may comprise a hydrolase functional group such as a methoxy group and/or an ethoxy group in the one end. Also, the silane compound may comprise an amino group, a vinyl group, an epoxy group, a methacryloxy group, an acryloxy group, a ureido group, a mercapto group, a sulfido group, or an isocyanate group. For example, the primer may comprise imidazole, 3-glycidoxypropyltrimeth oxysilane, or tetramethyl orthosilicate.

The primer treatment may be performed specifically by applying and curing.

In the formation of plating in the operations B-2 and C-2, the coarse layer conducting wire 257*a* and a fine layer conducting wire 253*a* may be processed by a pattern forming method through ordinary exposure and development, and a copper plating method.

In the formation of plating in the operations B-2 and C-2, via filling of the coarse layer via (multiple vias) and the fine layer via may be performed by copper electroless plating and/or copper electroplating. In an example, depending on the implementation, some small vias of multiple vias may be early filled with an insulating material and the like.

The copper electroless plating may be performed by using a conductive colloid solution for the surface of a plating target to allow a colloid to be adsorbed in the inside surface of a via, or may be performed by pre-treatment of forming ions on the surface and forming a catalyst metal complex. Thereafter, a solution comprising copper ions and a reducing agent may be added to form or fill a conductive layer.

The copper electroplating may be performed by allowing the surface of a plating target to be digested in an electroplating solution, and applying a current to the electroplating solution through an electrode. The electroplating solution may comprise a water-soluble copper salt, a sulfuric acid, a chlorine ion, an accelerator, an inhibitor, a leveler, a wetting agent, and a brightener, and the like. The leveler may for example, comprise a polyvinyl imidazole containing compound, a polyvinyl pyrrolidone containing compound, polyethyleneimine and an imidazole-based compound, 3-diethylamino-7-(4-dimethylaminophenylazo)-5-phenylphenazinium chloride, and the like, and the density may be 0.01 g/L to 3 g/L, or 0.02 g/L to 0.8 g/L based on a total plating solution.

The brightener may for example, comprise sodium 3-mercapto-1-propanesulfonate, bipyridine, and the density may be 0.01 g/L to 3 g/L, or 0.02 g/L to 0.5 g/L based on a total plating solution.

By properly adjusting the density of the brightener, accelerator, inhibitor, leveler, and the like, plating speed may be controlled by a mechanism of blocking a plating solution physically or disturbing chemical bonding during plating, and may enable via filling of multiple vias to be a desired shape.

The current density of the copper electroplating may be 3 $mA/cm^2$ to 50 $mA/cm^2$, and the processing time may be 500 seconds to 2000 seconds.

The via filling through copper plating of the multiple vias may allow small vias to have respective sizes of a certain or less with fixed intervals from one another, and thereby minimize the occurrence of a dimple or a void while showing good condition.

Additionally, the copper electroplating may be performed by forming a barrier in the surface of a plating target and the inside surface of multiple vias, copper plating for the external surface of multiple vias to be covered, and subsequent etching through chemical mechanical polishing.

While this disclosure includes specific examples, it will be apparent to one of ordinary skill in the art, after an understanding of the disclosure of this application, that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A connection structure of vias, comprising:
multiple vias disposed within an insulating layer,
wherein the multiple vias comprise a first via and two or more second vias disposed in a vertically stacked relationship with the first via,
wherein the first via and the two or more second vias are configured to meet at a common surface,
wherein the first via comprises a first via hole and a first via pad connected to each other,
wherein the two or more second vias are each disposed on the first via pad in contact with the first via hole,
wherein the two or more second vias are arranged per one first via and are in contact with the first via pad, and
wherein the two or more second vias comprise three or more second vias arranged in a polygonal shape surrounding a center of the first via pad.

2. The connection structure of claim 1, wherein the multiple vias are configured to transmit electrical signals in an upward direction and a downward direction.

3. A substrate, comprising:
a through hole extending through the substrate in a thickness direction;
a core substrate in which the through hole is formed;
a rewiring layer formed on a first surface of the core substrate; and
an electrically conductive layer having a predetermined shape and comprising a core conductive layer and a rewiring conductive layer embedded in the rewiring layer,
wherein the core conductive layer comprises:
a first conductive layer disposed on the first surface of the core substrate;
a through-hole conductive layer disposed in the through hole extending through the core substrate; and
a second conductive layer disposed on a second surface of the core substrate opposite the first surface,
wherein the core conductive layer is electrically connected to the rewiring conductive layer comprising an insulating layer and a connection structure of vias,
wherein the connection structure of vias comprises multiple vias disposed in the insulating layer,
wherein the multiple vias comprise a first via and two or more second vias disposed in a vertically stacked relationship,
wherein the first via and the two or more second vias are configured to meet at a common surface,
wherein the first via comprises a first via hole and a first via pad connected to each other,
wherein the two or more second vias are each disposed on the first via pad in contact with the first via hole,
wherein the two or more second vias are arranged per one first via and are in contact with the first via pad, and
wherein the two or more second vias comprise three or more second vias arranged in a polygonal shape surrounding a center of the first via pad.

4. The substrate of claim 3, wherein an interval between the two or more second vias in contact with the first via pad is equal to or greater than 0.2 μm.

5. The substrate of claim 3, wherein each of the two or more second vias in contact with the first via pad has a size between 10 μm and 100 μm.

6. The substrate of claim 3, wherein the two or more second vias are disposed in a row on the first via.

7. The substrate of claim 3, wherein the core substrate comprises a silicon-based ceramic substrate, a glass-based ceramic substrate, a glass substrate, or combinations thereof.

8. A semiconductor comprising:
the substrate of claim 3, and
a semiconductor element mounted in the substrate.

9. An electronic device substrate, comprising:
through holes extending through the electronic device substrate in a thickness direction;
a core substrate in which the through holes are formed; and
an upper rewiring layer disposed on a first surface of the core substrate,
wherein the electronic device substrate comprises an electrically conductive layer having a predetermined shape and configured to transmit electrical signals,
wherein the electrically conductive layer is configured to electrically connect an upper portion of the core substrate and a lower portion of the core substrate through at least some of the through holes,
wherein the electrically conductive layer includes a rewiring conductive layer comprising multiple vias configured to transmit electrical signals in an upward direction and a downward direction,
wherein the multiple vias comprise a first via and two or more second vias disposed in a vertically stacked relationship,
wherein the first via comprises a first via hole and a first via pad connected to each other,
wherein the two or more second vias are each disposed on the first via pad in contact with the first via hole,
wherein the two or more second vias are arranged per one first via and are in contact with the first via pad, and wherein the two or more second vias comprise three or more second vias arranged in a polygonal shape surrounding a center of the first via pad.

* * * * *